(12) United States Patent
Colinge

(10) Patent No.: US 8,178,862 B2
(45) Date of Patent: May 15, 2012

(54) JUNCTIONLESS METAL-OXIDE-SEMICONDUCTOR TRANSISTOR

(75) Inventor: Jean-Pierre Colinge, Cork (IE)

(73) Assignee: University College Cork, National University of Ireland Cork, Cork (IE)

( * ) Notice: Subject to any disclaimer, the term of this patent is extended or adjusted under 35 U.S.C. 154(b) by 179 days.

(21) Appl. No.: 12/753,668

(22) Filed: Apr. 2, 2010

(65) Prior Publication Data

US 2010/0276662 A1  Nov. 4, 2010

Related U.S. Application Data

(63) Continuation of application No. PCT/EP2009/006444, filed on Sep. 4, 2009.

(60) Provisional application No. 61/094,709, filed on Sep. 5, 2008.

(30) Foreign Application Priority Data

Sep. 5, 2008  (EP) ..................... 08105248

(51) Int. Cl.
 *H01L 29/06* (2006.01)
(52) U.S. Cl. .............. 257/9; 438/289; 257/E21.409; 257/E29.245; 257/E29.255; 257/402
(58) Field of Classification Search ....... 257/9, E21.409, 257/E29.245, E29.255, 402; 438/289
See application file for complete search history.

(56) References Cited

U.S. PATENT DOCUMENTS

| | | |
|---|---|---|
| 1,900,018 A | 3/1928 | Lilienfeld |
| 1,745,175 A | 1/1930 | Lilienfeld |
| 7,880,163 B2 | 2/2011 | Soree et al. |
| 2004/0201107 A1 | 10/2004 | Koenenkamp |
| 2005/0056892 A1 | 3/2005 | Seliskar |
| 2005/0274992 A1* | 12/2005 | Appenzeller et al. ......... 257/288 |
| 2006/0128088 A1 | 6/2006 | Graham et al. |
| 2007/0040221 A1 | 2/2007 | Gossner et al. |
| 2007/0132009 A1 | 6/2007 | Takeuchi et al. |
| 2008/0251862 A1* | 10/2008 | Fonash et al. ................. 257/408 |

FOREIGN PATENT DOCUMENTS

| | | |
|---|---|---|
| CA | 272437 | 7/1927 |
| EP | 0 709 893 A2 | 5/1996 |
| WO | WO 03/026034 A1 | 3/2003 |
| WO | WO 2004/040666 A1 | 5/2004 |

OTHER PUBLICATIONS

The Notification of Transmittal of the International Search Report and The Written Opinion of the International Searching Authority, or the Declaration dated Dec. 4, 2009 for PCT/EP2009/006444 filed Sep. 4, 2009 (in 16 pages).

(Continued)

*Primary Examiner* — Jami M Valentine
(74) *Attorney, Agent, or Firm* — Volpe and Koenig, P.C.

(57) ABSTRACT

A junctionless metal-oxide-semiconductor transistor is described. In one aspect, a transistor device comprises a semiconductor material. The semiconductor material comprises first, second, and third portions. The second portion is located between the first and third portions. The first, second, and third portions are doped with dopants of the same polarity and the same concentration. The transistor device further comprises an electrode connected to the second portion. A current flows between the first and third portions when a voltage is applied to the electrode.

40 Claims, 14 Drawing Sheets

OTHER PUBLICATIONS

Afzalian et al. "MultiGate SOI MOSFETs: Accumulation-Mode vs. Enhancement-Mode." *IEEE 2008 Silicon Nanoelectronics Workshop.* Jun. 15-16, 2008, Honolulu, HI (in 2 pages).

Colinge. "Conduction Mechanisms in Thin-film Accumulation-Mode SOI p-Channel MOSFET's." *IEEE—Transactions on Electron Devices.* 37(3):718-723 (1990).

Colinge. "From Gate-All-Around to Nanowire MOSFETs." *2007 International Semiconductor Conference.* pp. 11-17. Oct. 15-17, 2007, Sinaia, Romania.

Colinge. "Multi-gate SOI MOSFETs." *Microelectronic Engineering.* 84(9-10):2071-2076 (2007).

Han et al. "Design Consideration of Body-Tied FinFETs ($\Omega$ MOSFETs) Implemented on Bulk Si Wafers." *Journal of Semiconductor Technology and Science.* 4(1):12-17 (2004).

Iqbal et al. "The Nanoscale Silicon Accumulation-Mode MOSFET—A Comprehensive Numerical Study." *IEEE Transactions on Electron Devices.* 55(11):2946-2959 (2008).

Okano et al. "Process Integration Technology and Device Characteristics of CMOS FinFET on Bulk Silicon Substrate with sub-10 nm Fin Width and 20 nm Gate Length." *IEDM Technical Digest.* pp. 721-724 (2005).

Park et al. "Accumulation-Mode Pi-gate MOSFET." *2003 IEEE International SOI Conference Proceedings.* pp. 65-67 (2003).

Pott et al. "Conduction in Ultra-thin SOI Nanowires Prototyped by FIB Milling." *Microelectronic Engineering.* 83(4-9):1718-1720 (2006).

Rauly et al. "Investigation of Deep Submicron Single and Double Gate SOI MOSFETs in Accumulation Mode for Enhanced Performance." *Electrochemical and Solid-State Letters.* 4(3):G28-G30 (2001).

Rauly et al. "Investigation of Single and Double Gate SOI MOSFETs in Accumulation Mode for Enhanced Performances and Reduced Technological Drawbacks." *Proceeding of the 30th European Solid-State Devise Research Conference.* Sep. 11-13, 2000. pp. 540-543.

Shan et al. "Unipolar Accumulation-Type Transistor Configuration Implemented Using Si Nanowires." *Applied Physics Letters* 91:093518-1-093518-3 (2007).

Shan et al. "Self-Assembling Silicon Nanowires for Device Applications Using the Nanochannel-Guided 'Grow-in-Place' Approach." *ACS Nano,* 2(3), pp. 429-434 (2008).

Yan et al. "Doping Fluctuation Effects in Trigate SOI MOSFETs." *Conference Proceedings 4th EuroSOI Workshop.* Jan. 23-25, 2008, Cork, Ireland. pp. 65-66.

Yang et al. "5nm-gate Nanowire FinFET." *2004 Symposium on VLSI Technology Digest of Technical Papers.* pp. 196-197 (2004).

Cui et al., "High Performance Silicon Nanowire Field Effect Transistors," Nano Letters (2003), pp. 149-152.

Doyle et al., "High Performance Fully-Depleted Tri-Gate CMOS Transistors," IEEE Electron Device Letters, vol. 24, No. 4 (Apr. 2003), pp. 263-265.

Thompson et al., "A 90-Nm Logic Technology Featuring Strained-Silicon," IEEE Transactions on Electron Devices, vol. 51, No. 11, (Nov. 2004), pp. 1790-1797.

Ramos, et al., "Experimental Evidence of Short-Channel Electron Mobility Degradation Caused by Interface Charges Located at the Gate-Edge of Triple-Gate Finfets," International Conference on Solid-State and Integrated Circuit Technology (ICSICT), (2006), pp. 72-74.

Xiang et al., "Ge/Si Nanowire Heterostructures as High-Performance Field-Effect Transistors," Nature, vol. 441/25, (May 2006), pp. 489-493.

Colinge, J.P., FinFETs and Other Multi-Gate Transistors, Springer, (2007).

Shan, et al., "Unipolar Accumulation-Type Transistor Configuration Implemented Using Si Nanowires," Applied Physics Letters 91, 093518 (2007).

Weis, et al., "Low Power SRAM Cell Using Vertical Slit Field Effect Transistor (VeSFET)," ESSCIRC Fringe p. 6 (2008).

Sorée, et al., "Analytical and Self-Consistent Quantum Mechanical Model for a Surrounding Gate MOS Nanowire Operated in JFET Mode," J. Computational Electronics, Springer (2008) 7, pp. 380-383.

Afzalian et al., "MultiGate SOI MOSFETs: Accumulation-Mode vs. Enhancement Mode," IEEE Silicon Nanoelectronics Workshop, (2008).

Weber, et al., "High Immunity to Threshold Voltage Variability in Undoped Ultra-Thin FDSOI MOSFETs and Its Physical Understanding," Tech. Dig. IEDM, (2008), pp. 245-248.

Electrical Properties of Silicon—website reference http://www.ioffe.ru/SVA/NSM/Semicond/Si/electric.html.

* cited by examiner

With X ranging from 1 to 10, typically

With X ranging from 1 to 10, typically

JUNCTIONLESS METAL-OXIDE-SEMICONDUCTOR TRANSISTOR

CROSS-REFERENCE TO RELATED APPLICATIONS

This application is a continuation of International Application No. PCT/EP2009/006444, filed Sep. 4, 2009, which claims priority to U.S. Provisional Application No. 61/094,709 and to European Application No. 08105248.2, both filed Sep. 5, 2008. The above-referenced applications are hereby incorporated by reference in their entirety.

BACKGROUND

1. Field

The invention relates to transistors, and in particular provides a new type of transistor based on a nano-scale architecture.

2. Description of Related Technology

A classical transistor is a solid-state active device that controls current flow. A transistor usually comprises a semiconducting material, such as silicon or germanium, in three electrode regions with two junctions. The regions are alternately doped positive-negative-positive or negative-positive-negative in a semiconducting sandwich.

All existing transistors are based on the formation of junctions. Junctions are capable of both blocking current and letting current flow, depending on the applied bias. Junctions are typically formed by putting in contact two semiconductor regions with opposite polarities. The most common junction is the PN junction, which consists of a contact between a P-type piece of silicon, rich in holes, and an N-type piece of silicon, rich in electrons. Every textbook on Semiconductor Device Physics contains a chapter on the classical PN Junction and is known by every engineering/physics student. Other types of junctions include the metal-silicon "Schottky" junction and the heterojunction, which is a PN junction comprising two types of semiconductor materials. The bipolar junction transistor contains two PN junctions, and so does the MOSFET. The JFET (Junction Field-Effect Transistor) has only one PN junction and the MESFET (Metal-Semiconductor Field-Effect Transistor) contains a Schottky junction.

Typically, all Metal Oxide Semiconductor (MOS) transistors are made using two junctions comprising a source junction and a drain junction. An n-channel transistor is a N-P-N structure. A p-channel transistor is a P-N-P structure. Trends in the electronic industry require smaller and smaller components resulting in transistor sizes down to the nano-scale. This trend has presented significant problems in the manufacture and reliable operation of these devices.

Over the past decades, the Metal Oxide Semiconductor Field Effect Transistor (MOSFET) has continually been scaled down in size; typical MOSFET channel lengths were once several micrometers, but modern integrated circuits are incorporating MOSFETs with channel lengths of less than a tenth of a micrometer. For example, Intel Corporation began production of a process featuring a 65 nm feature size (with the channel being even shorter) in early 2006. Until the late 1990s, this scaling resulted in great improvement in MOSFET circuit operation. Historically, the difficulties with decreasing the size of the MOSFET have been associated with the semiconductor device fabrication process, the need to use very low voltages, and with poorer electrical performance necessitating circuit redesign and innovation (small MOSFETs exhibit higher leakage currents, and lower output resistance, discussed below).

The semiconductor industry maintains a "roadmap", the ITRS, describing forecasts and technology barriers to development for device sizes updated approximately annually. The 2006 roadmap estimated devices with a physical gate length of 13 nm in size by the year 2013.

Very small transistors have the problem that one has to form two junctions, namely a source and a drain junction that are separated by a region with doping different of that in the junctions. For example, N-type doping with a concentration of $10^{20}$ atoms/cm$^3$ is used in the source and drain and P-type doping with a concentration of $1\times10^{19}$ atoms/cm$^3$ is used between the source and drain. The diffusion of source and drain doping atoms is difficult to control in very small transistors. In all transistors, the diffusion of source and drain impurities is a bottleneck to the fabrication of very short-channel devices, and very low thermal budget processing must be used. For example flash heating can be used to heat to very high temperatures for a short time period so as to minimize the length of time at elevated temperatures require expensive equipment and thus costly processing steps.

Very costly techniques are used to minimise this diffusion, but even in the absence of the diffusion the statistical variation of the impurity concentration can cause device parameter variation problems.

In Silicon-On-Insulator (SOI) structures and related structures (FinFETs, Multigate FETs, Pi-gate FETs, Omega-gate FETs, Gate-all-Around FETs), one can use an intrinsic channel region (undoped region instead of the P-type region). One can also use a channel region with the same doping type as the source and drain; the transistor is then an accumulation-mode device: $N^+$-$N$-$N^+$ for an n-channel device and $P^+$-$P$-$P^+$ for a p-channel transistor. See for example a paper entitled "Conduction mechanisms in thin-film, accumulation-mode p-channel SOI MOSFETs", J P Colinge, IEEE-Trans on Electron. Dev., vol. 37, p. 718, 1990, or a paper entitled "Accumulation-mode Pi-gate MOSFET", J. W. Park, W. Xiong, J. P. Colinge, Proceedings of the IEEE International SOI Conference, pp. 65-67, 2003 for further explanation.

German Patent Publication Number DE102005039365, Infineon Technologies AG, describes the fabrication of ElectroStatic Discharge (ESD) structures using multigate FETs. The Infineon publication discloses using regular inversion-mode devices ($N^+P^-N^+$) and accumulation-mode transistors ($N^+N^-N^+$).

A paper published by Pott et al entitled 'Conduction in Ultra-thin SOI nanowires prototyped by FIB milling', Microelectronic Engineering Elsevier Publishers BV, vol. 83, no. 4-9, 1 Apr. 2006, pages 1718-1720 discloses a simple and fast method to fabricate gated Si NWs by using FIB milling on SOI substrates. The paper describes measurements made on 'classical' nanowire transistors and suffers from the same problems outlined above.

European Patent EP0709893A2, Canon K K, discloses a SOI circuit with NPN and PNP transistor devices. PCT Patent Publication Number WO03026034, Hahn Meitner Inst Berlin GMBH, describes the fabrication of transistors by deposition of semiconductor material in cylindrical holes made in a plastic sheet.

PCT Patent Publication Number WO2004/040666, Infineon Technologies AG, describes broadly the concept of formation of vertical nanowire transistors. The patent publication describes a number of types of material including carbon nanotubes, all semiconductors, ferroelectric materials, inverter devices (NMOS+PMOS), magnetic materials, polysilicon and titanium, niobium and aluminum.

A further problem with accumulation-mode devices, made in "thick" silicon films (thicker than 20 nm), is that they exhibit worse short-channel characteristics because the channel (or the peak of carrier concentration in sub-threshold operation) is located further from the gate electrode than in "regular" (i.e. inversion-mode) transistors. This detrimental effect can be reduced when the silicon film is thinned down, as shown in the paper entitled "Investigation of Deep Submicron Single and Double Gate SOI MOSFETs in Accumulation Mode for Enhanced Performance", E. Rauly, B. Iñiguez, D. Flandre, Electrochemical and Solid-State Letters, vol. 4 (3), pp. G28-G30 (2001).

In multigate MOSFETs with a small enough cross section, there is no difference in short-channel effects between accumulation and inversion-mode devices, as shown in the paper entitled "MultiGate SOI MOSFETs: Accumulation-Mode versus Enhancement-Mode", A. Afzalian, D. Lederer, C. W. Lee, R. Yan, W. Xiong, C. Rinn Cleavelin, J P Colinge, IEEE 2008 Silicon Nanoelectronics Workshop, P1-6, June 15-16, Honolulu, USA, 2008.

There is therefore a need to provide a transistor device structure and architecture to overcome the above mentioned problems.

SUMMARY

In one aspect, a transistor device comprises a semiconductor material. The semiconductor material comprises first, second, and third portions. The second portion is located between the first and third portions. The first, second, and third portions are doped with dopants of the same polarity and the same concentration. The transistor device further comprises an electrode connected to the second portion. A current flows between the first and third portions when a voltage is applied to the electrode.

In another aspect, a transistor device comprises a semiconductor material. The semiconductor material comprises first, second, and third portions. The second portion is located between the first and third portions. The first, second, and third portions are doped with dopants of the same polarity and the same concentration. The concentration of the dopants is approximately $1 \times 10^{19}$ atoms/cm$^3$ or greater. The transistor device further comprises an electrode connected to the second portion. A current flows between the first and third portions when a voltage is applied to the electrode.

In another aspect, a method of manufacturing a transistor device comprises doping first, second, and third portions of a semiconductor material with dopants of the same polarity and the same concentration. The second portion is located between the first and third portions. The method further comprises connecting an electrode to the second portion. A current flows between the first and third portions when a voltage is applied to the electrode.

In another aspect, a transistor device comprises first, second, and third means for conducting a current. The second means is located between the first and third means. The first, second, and third means are doped with dopants of the same polarity and the same concentration. The transistor device further comprises means for applying a voltage to the second means. A current flows between the first and third means when a voltage is applied.

BRIEF DESCRIPTION OF THE DRAWINGS

The invention will be more clearly understood from the following description of an embodiment thereof, given by way of example only, with reference to the accompanying drawings, in which:—

DETAILED DESCRIPTION

Figure 1:
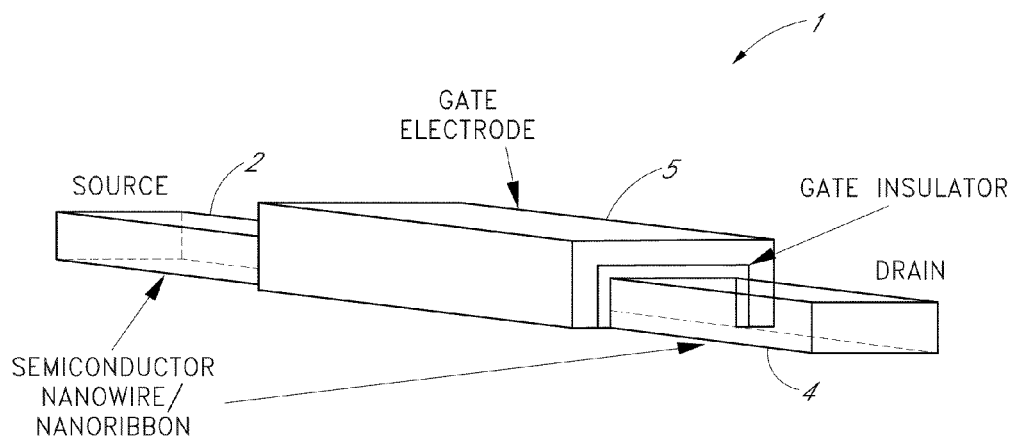
FIG. 1 illustrates a three-dimensional perspective view of a junctionless transistor according to the invention.

In one embodiment, the invention provides junction-less transistor comprising a source, a drain and a connecting channel, characterized in that the channel is a nano-structure device, controlled by a gate electrode, to allow current flow between the source and drain. The doping in the channel comprises the same polarity and same doping concentration as in the source and drain. The transistor comprises means for varying a gate voltage to control the current flow between the source and drain. The invention provides for a new construction of a transistor based on a junctionless structure approach. The diffusion effects are eliminated based on the realisation by the inventors that diffusion occurs only if a gradient of concentration is present. The invention is particularly suitable for use in a multi-gate transistor structure.

In another embodiment, there is provided a junction-less transistor comprising a source, a drain and a connecting channel, characterised in that:
the channel is a nano-structure device, controlled by a gate electrode, to allow current flow between the source and drain; and
the doping in the channel comprises the same polarity and same doping concentration as in the source and drain, wherein the gate electrode comprises means for varying a voltage to control the current flow between source and drain.

The invention provides for a revolutionary architecture of a new transistor, based on a new junctionless structure approach to what is otherwise known in the industry such as "accumulation mode" devices. This invention provides a junctionless transistor, in which the doping in the source and drain, and in between, is of the same type and the same dopant concentration. The result is that the transistor device of the present invention ensures that all dopant diffusion and statistical spread problems are eliminated. This greatly relaxes thermal budget constraints and facilitates processing. The doping concentration in the channel is heavier than in classical devices because it is the same as in the source and drain. A further advantage of having a junctionless transistor is that there is no electron reflections such that no energy dissipation in the transistor occurs.

The end product is a new type of transistor construction and presents an enormous market for the inventive transistor devices in this field. The applications of transistors in ICs are in memory and in microprocessors. For example, all AMD processors as well as the IBM/Toshiba/Sony Cell processors used in Playstation, X-Box, etc, which are made using SOI (Silicon-On-Insulator) processes, can directly benefit from the junctionless structure described here.

In one embodiment the channel is dimensioned to allow for full depletion of electron carriers across the channel. The key to fabricating a junctionless transistor (in other words a gated resistor) according to the invention is the formation of a semiconductor layer that is thin and narrow enough to allow for full depletion of carriers when the device is turned off. The semiconductor also needs to be heavily doped to allow for a decent amount of current flow when the device is turned on. To improve the ON/OFF ratio of the transistor the smaller dimension of the channel and the higher the doping is desirable. It will be appreciated that the source and drain are defined by the Gate length.

In one embodiment the transistor comprises means for applying a low gate voltage to provide a region depleted of electron carriers across the channel to keep the transistor in an OFF state.

In one embodiment the transistor comprises means for applying a high gate voltage to provide a region of electron carriers across the channel to keep the channel in an ON state.

In one embodiment the nano-structure device is a nanowire or nano-ribbon device. It will be appreciated that the channel can be small enough in any dimension to allow for the depletion of electron carriers across the channel. In a particularly preferred embodiment the channel length and/or width is of the order of 10 nm or less.

In another embodiment of the present invention there is provided, a transistor comprising a source, a drain and a connecting channel, characterised in that the doping in the channel is of the same polarity as in the source and/or drain, and substantially of the same concentration as in the source and/or drain, such that diffusion effects between the source channel and drain are substantially eliminated. The diffusion is eliminated since diffusion occurs only if a gradient of concentration is present.

In another embodiment there is provided a multi-gate transistor structure comprising a plurality of transistors characterized in that each transistor comprises a source, a drain and a connecting channel, wherein the channel is a nano-structure device, controlled by a gate voltage, to allow current flow between source and drain; and the doping in the channel comprises the same polarity and same doping concentration as in the source and drain.

In one embodiment the multi-gate transistor structure comprises means for varying the gate voltage to control the current flow between source and drain.

Non-SOI devices such as the "bulk FinFET" device described in [K. Okano et al.: Process Integration Technology and Device Characteristics of CMOS FinFET on Bulk Silicon Substrate with Sub-10 nm Fin Width and 20 nm Gate Length. Technical Digest of IEDM, 725 (2005)] or the "body-tied FinFET" described in [Kyoung-Rok Han et al.: Design considerations of body-tied FinFETs (ΩMOSFETs) implemented on bulk Si wafers, Journal of Semiconductor Technology and Science 4-1, 12 (2004)] can also be fabricated with a junctionless architecture, provided appropriate electrical isolation from the substrate is achieved.

In one embodiment the source, the drain and connecting channel comprises a $N^+$-$N^+$-$N^+$ device to provide a junctionless device.

In another embodiment the source, the drain and connecting channel comprises a $P^+$-$P^+$-$P^+$ device to provide a junction-less device.

Preferably, the doping concentration in the source and drain is approximately $1 \times 10^{19}$ to $1 \times 10^{20}$ atom/cm$^3$. It will be appreciated that the doping concentration depends on the cross-sectional dimensions of the channel. The doping decreases as the dimensions are increased, in order to allow for the gate potential to deplete the channel of carriers when the device is turned off.

The cross section of the channel is a section through the device that is perpendicular to the source-to-drain direction. The term "cross section dimensions" or "cross sectional dimensions" includes the "width" and the "height" or "thickness" of the semiconductor channel. It applies to devices such as FinFETs where the height is larger than the width, devices such as trigate transistors where the width is sensibly equal to the height, and nanoribbon devices where the width is larger than the thickness. It also applies to devices with a rounded or circular cross section and planar SOI devices which are essentially nanoribbon devices with a large width. Thus in a tall device with small width (e.g. FinFET), the cross section dimension is essentially equal to the width, in a planar SOI device the cross section dimension is essentially equal to the SOI film thickness, and in a cylindrical nanowire the cross section dimension is essentially equal to the diameter. The cross section must be small enough for the channel region to be depleted on carriers when a gate voltage is applied to turn the device off. The actual minimum cross dimension value is related to the channel doping concentration. Thus, the higher the doping concentration, the smaller the cross section required.

Suitably, the transistor is incorporated in a multi-gate FinFET, Tri-gate, Pi-gate, omega-gate or gate-all-around structure.

In one embodiment the junction-less transistor comprises use of spacer technology to locally increase the doping concentration in the source and drain regions outside the region of electrostatic influence of the gate. To cite an example, a doping concentration of $0.8 \times 10^{20}$ cm$^{-3}$ can be used in the channel region and the source and drain regions (thereby forming a junction-less structure) and spacer technology can be used to locally increase the doping concentration in diffusion regions adjacent to the source and drain to a concentration above $10^{20}$ cm$^{-3}$.

It will be appreciated that all existing technology "boosters" used in conventional semiconductor technology can be applied to the junctionless transistor in a straightforward manner. These include, but are not limited to: spacer technology, Silicide (or Salicide) formation, use of High-k dielectric materials, use of a metal gate, use of a TiN gate, use of strain technology, use of semiconductor materials such as Germanium, SiGe, SiGeC, III-V alloys, use of polycrystalline semiconductors, use of semiconductors with grain boundaries or other localized charge trapping regions, use of charge-trapping dielectric layers (such as ONO and nanocrystal-containing oxides), use of nanowire transistors with non-uniform channel cross sections (e.g. with diameter constrictions). In particular, spacer technology can be used to locally increase the doping concentration in the source and drain regions outside the region of electrostatic influence of the gate electrode. To cite an example, a doping concentration of $0.8 \times 10^{20}$ cm$^{-3}$ can be used in the channel region and the source and drain extension regions (thereby forming a junctionless structure) and spacer technology can be used to locally increase the outer source and drain regions to a concentration above $10^{20}$ cm$^{-3}$.

Referring now to the drawings, and initially FIGS. 1 to 4, FIG. 1 illustrates a three-dimensional perspective view of a junctionless transistor according to the invention indicated generally by the reference numeral 1. The underlying insulator layer (buried oxide) is not shown. A semiconductor nanowire structure, for example a nanowire or nanoribbon, forms a source 2, channel 3 and drain 4, partially surrounded by a gate electrode 5. The source 2 and drain 4 are the portions of the semiconductor nanowire that are not covered by the gate electrode 5. A small layer of gate insulator 6 can be provided between the gate electrode 5 and the channel 3. In a classical MOSFET they are defined by junctions, but this is not the case in the junctionless transistor device of the invention.

In a classical MOSFET the junctions are situated underneath the edges of the gate (or very close to the edges of the gate, depending on processing parameters). In a similar way, the invention defines the boundary between the source and the channel region of the junctionless transistor as the portion of the semiconductor situated underneath the edge of the gate or in its immediate vicinity. Similarly, the invention defines the boundary between the drain and the channel region of the junctionless transistor as the portion of the semiconductor situated underneath the other edge of the gate or in its immediate vicinity. It will be appreciated that the device been symmetrical the source and drain can be interchanged.

Figure 2:
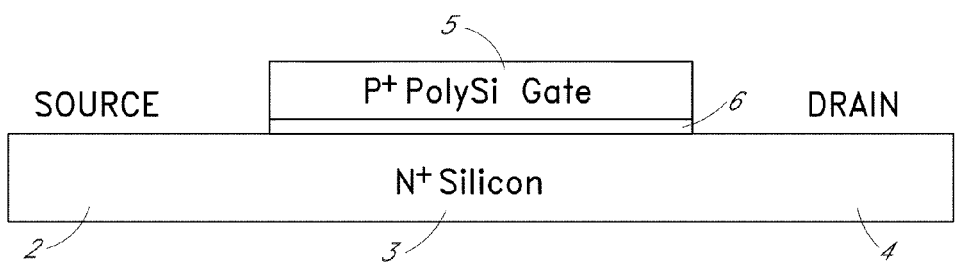
FIG. 2 illustrates a longitudinal cross section implementation of an N-type silicon junctionless transistor according to the invention.
Figure 3:
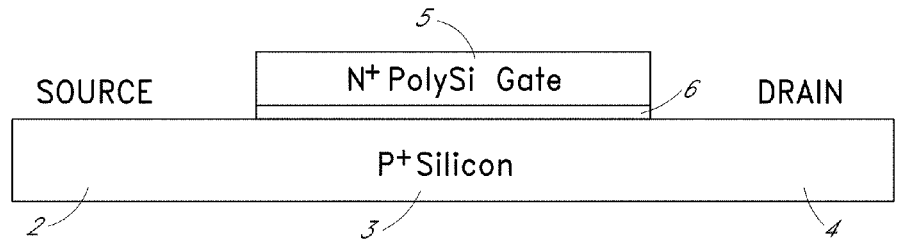
FIG. 3 illustrates a longitudinal cross section implementation of a P-type silicon junctionless transistor according to the invention.

In an N-channel (N-type) device, as shown in FIG. 2 the distinction is that the source 2 is the at a lower potential than the drain 4. In a P-type device, as shown in FIG. 3, the source 2 is at a higher potential than the drain 4.

Figure 4A:
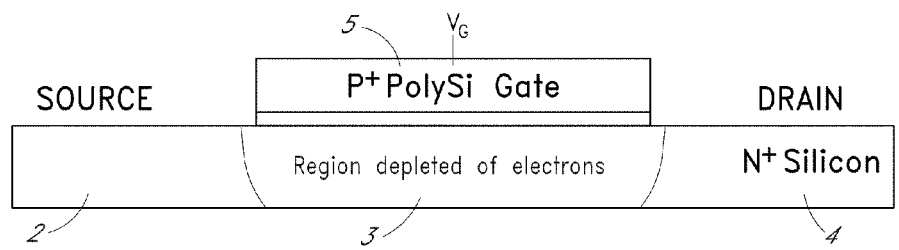
FIG. 4 is a number of views illustrating a sample operation of a N-type transistor according to the invention.
Figure 4B:
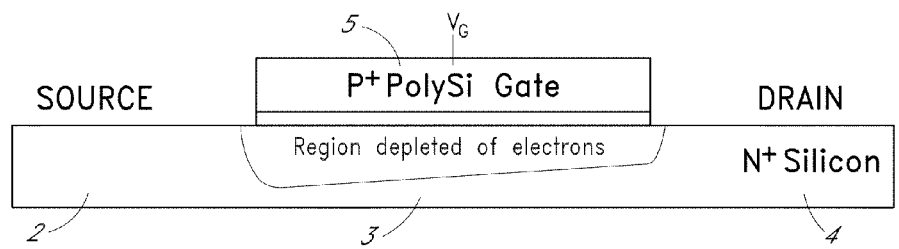
Figure 4C:
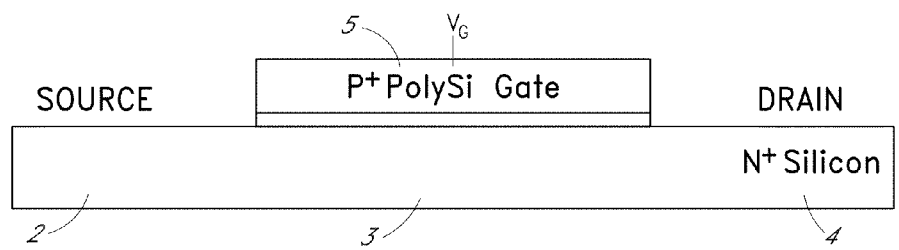

FIG. 4 is a number of views illustrating a sample operation of a N-type transistor according to the invention. How the device works (example of an N-type device) with $V_G(A)<V_G(B)<V_G(C)$ is as follows:

A: For a low gate voltage, for example 0V, the channel region 3 under the gate 5 is depleted of carriers and no current can flow between source 2 and drain 4. The device is effectively in an OFF state.

B: For a higher gate voltage, for example 0.4V, the channel region 3 under the gate 5 is partially depleted of carrier and some current can flow between source 2 and drain 4.

C: For a still higher gate voltage, for example 1V the region under the gate 5 is no longer depleted of carrier and can flow between source 2 and drain 4. The device is an ON state.

Figure 5A:
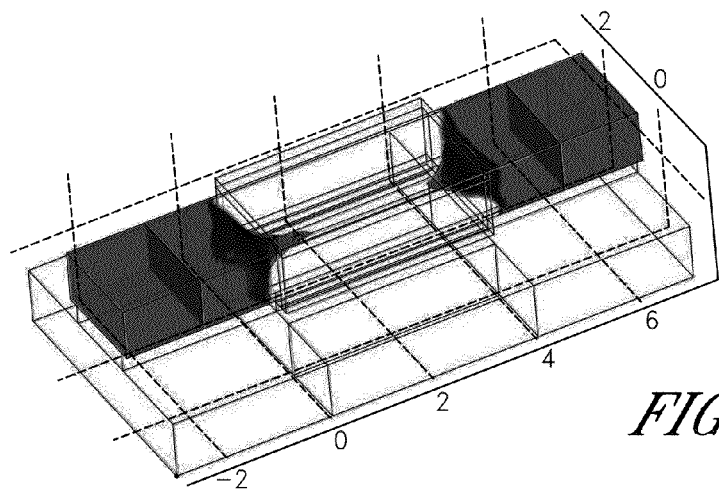
FIG. 5 illustrates a number of 3D perspective views illustrating sample operation of the junctionless transistor.
Figure 5B:
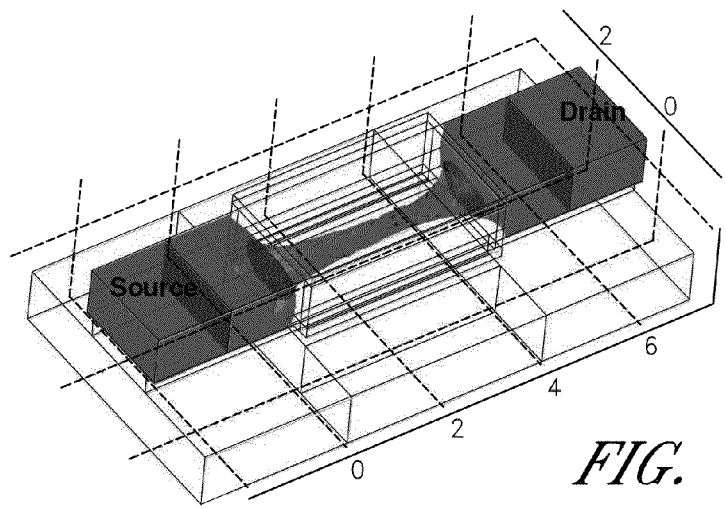
Figure 5C:
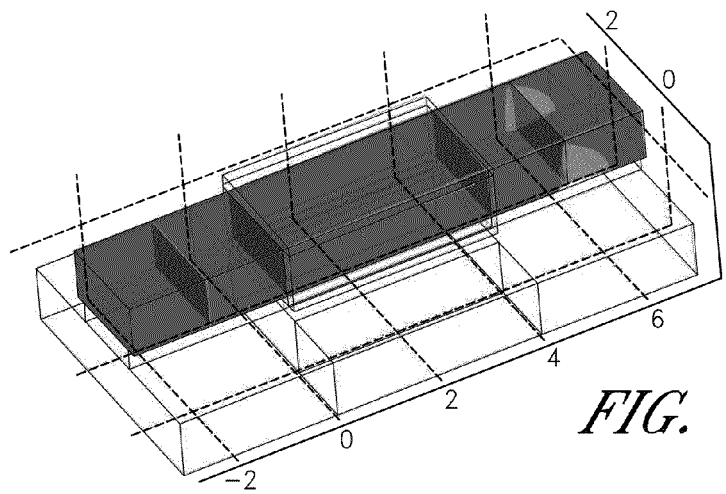
Figure 10:
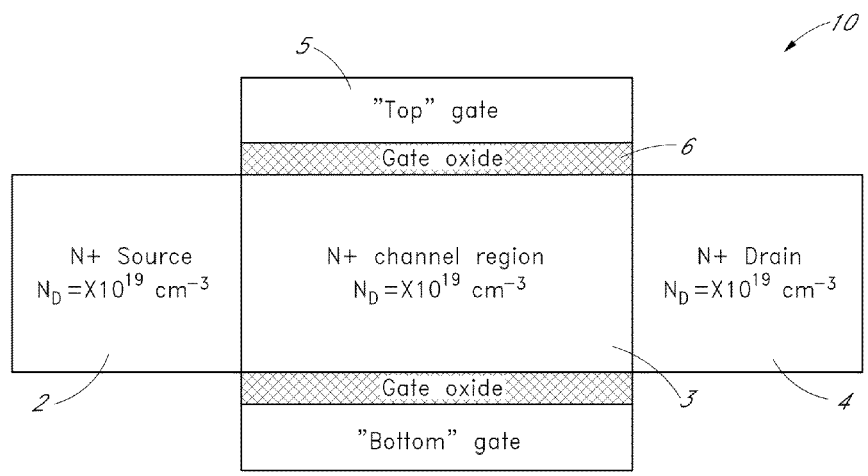
FIG. 10 illustrates a cross section of a gate-all-round device showing examples of doping concentrations.
Figure 11:
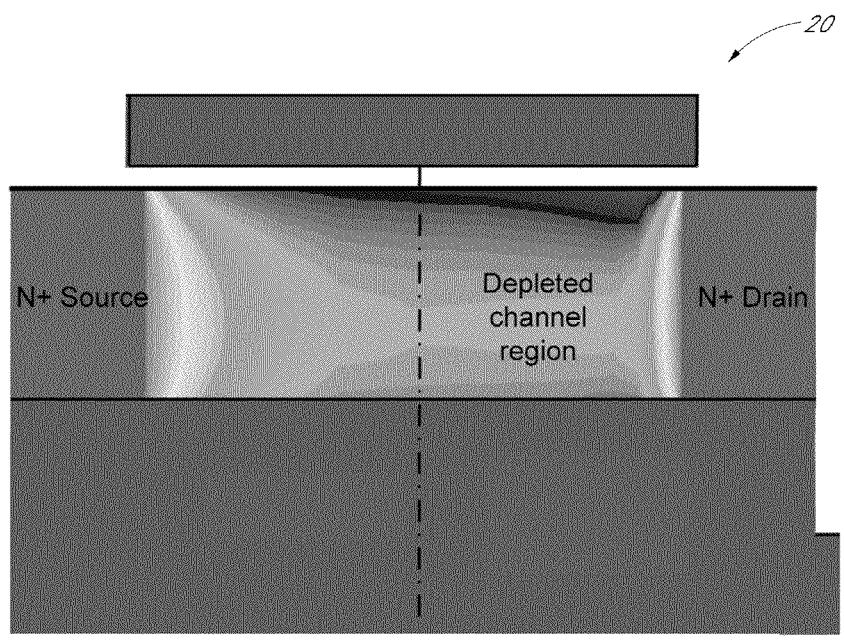
FIG. 11 illustrates the electron concentration in the transistor device when turned off (trigate "nanowire" cross section)
Figure 12:
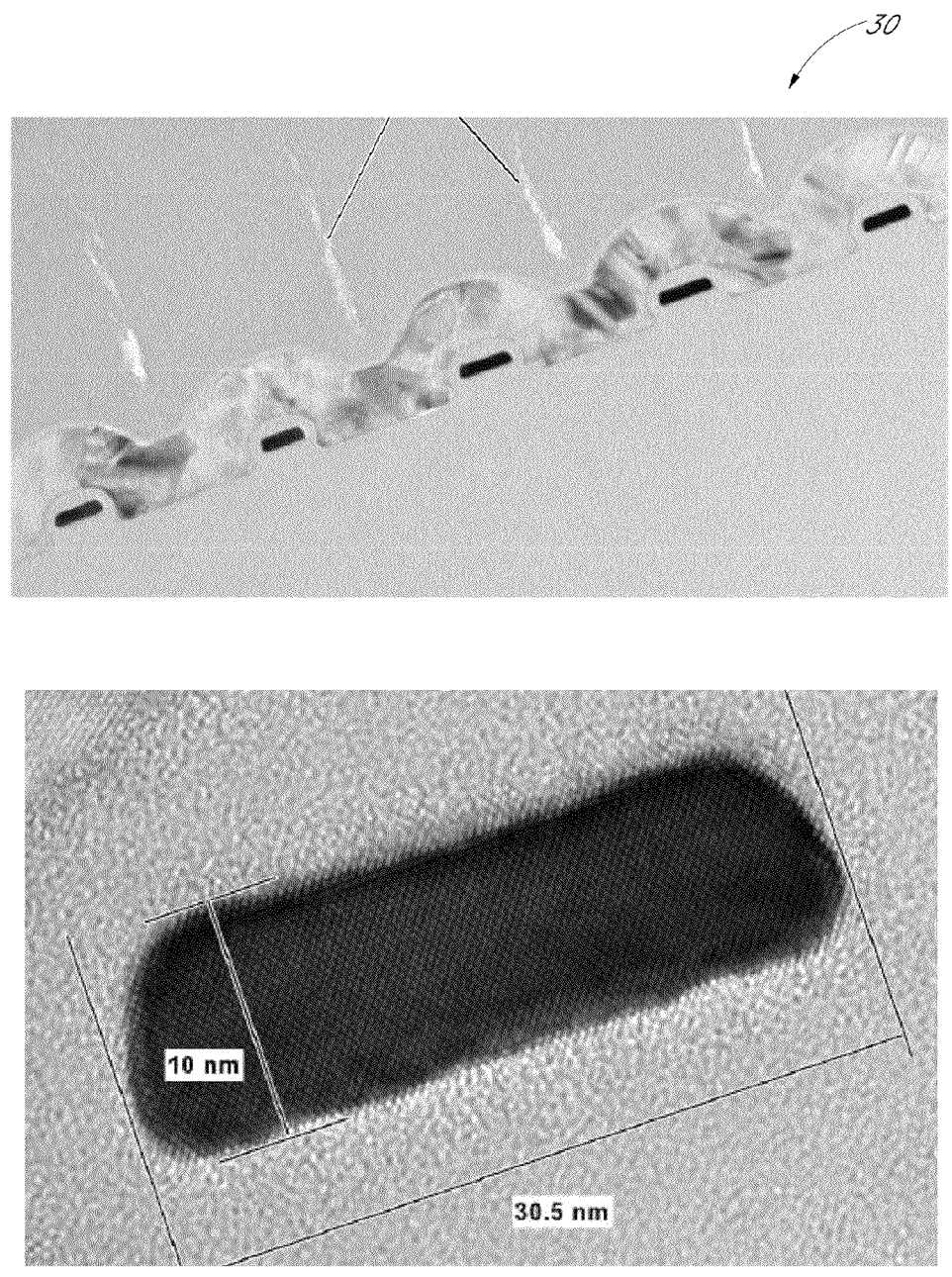
FIG. 12 illustrates a transmission electron microscopy image of a device (trigate "nanoribbon" cross section) according to the invention.

It will be appreciated that current can be further increased if gate voltage is increased beyond $V_G(C)$ through an increase of the electron concentration in the region underneath the gate. FIGS. 5 A, B and C illustrate a number of three dimensional perspective views equivalent to FIGS. 4 A, B and C to clearly show the electron flow distribution when different gate voltages are applied. It will be appreciated that if the gate 5 is dimensioned substantially around the channel (gate-all-around, for example as shown in FIGS. 10 to 12 below) greater control for the depletion of electrons can be achieved. In the simulation shown in FIG. 5 the following parameters were used: Channel length: 40 nanometers, Width of nanowire/nanoribbon: 20 nanometers, Height (thickness of nanowire): 10 nanometers and Doping concentration: N-type, 1e19 cm-3. As the gate voltage is varied the channel region 3 becomes depleted of electrons, similar to a 'pinching' or 'squeezing' effect when pressure is applied to a conduit with water flowing through it, such that electron flow is reduced until finally the channel is fully depleted of electrons to prevent further electron flow. The transistor is then in an OFF state.

Figure 6:
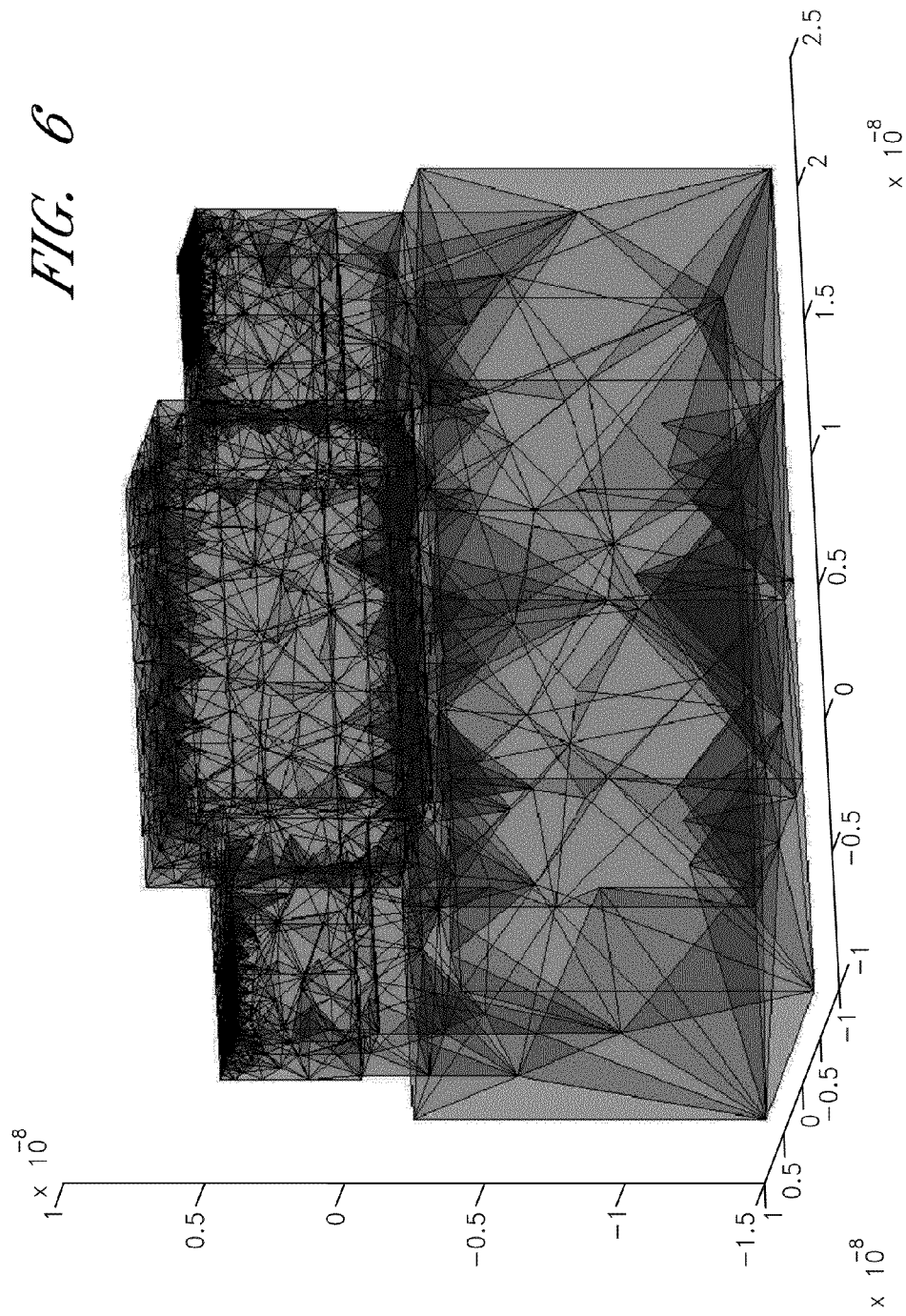
FIG. 6 illustrates a three dimensional mesh model (trigate "nanowire" cross section) of the transistor according to the present invention.

FIG. 6 shows a three dimensional mesh model of a junction-less transistor, according to the present invention. The doping in the source and drain and in between (in the channel) is of the same type, and of the same concentration. The simulated structure comprises Silicon thickness: $W_{si}=5$ nm; Silicon width: $t_{si}=5$ nm; gate oxide thickness: $T_{OX}=2$ nm: Channel length: L=15 nm; doping concentration: $N_D=8e19$ cm$^{-3}$.

Various different parameters can be used for the present invention, for example, an N-type doping with a concentration of $8 \times 10^{19}$ atoms/cm$^3$ is used in the source and drain and a N-type doping with a concentration of $8 \times 10^{19}$ atoms/cm$^3$ is used between the source and drain (i.e. "X"=8 in FIGS. 5 and 11. Optionally a P-type doping with a concentration of $8 \times 10^{19}$ atoms/cm$^3$ is used in the source and drain and a P-type doping with a concentration of $8 \times 10^{19}$ atoms/cm$^3$ is used between the source and drain. The inventive device provides the channel being of the same type and same concentration, such that all diffusion and statistical spread problems are eliminated. In other words, the doping used in the junctionless transistor device is of the same polarity (i.e. N or P) and the same concentration for source drain and connecting channel.

Here, the invention provides for the fabrication an N$^+$-N$^+$-N$^+$ (or P$^+$-P$^+$-P$^+$) device, where the doping concentration in the channel is comparable to that in the source and drain. Since the gradient of doping concentration between source and channel or drain and channel is very small, little or no diffusion can take place, which eliminates the need for costly ultrafast annealing techniques and allows one to fabricate devices with shorter channels.

A key point for such a device to operate properly is to fabricate it in a multi-gate (FinFET, Tri-gate, Pi-gate, omega-gate, gate-all-around) structure with sufficiently small width or cross section. In order to be able to turn the transistor device off, one must be able to deplete the channel region of its carriers (electrons in the case of an N$^+$-N$^+$-N$^+$ device). Junction-less transistor operation is achievable in a 'classical' (i.e. single-gate) SOI device, but in that case the silicon film thickness needs to be in the order of a few nanometers to be able to turn the current off. In a multi-gate architecture, the gate potential is able to deplete the channel from different sides, which allows one to use larger channel cross-sectional dimensions (thickness and/or width) than in a single-gate configuration. This is much easier to fabricate reproducibly.

A transistor device with a 10 nm×10 nm cross section and a doping concentration of $3\times10^{19}$ cm$^{-3}$ can be turned off by the gate and operate correctly as a MOS transistor. Such a transistor device is immune to doping diffusion effects, and, because the high doping concentration in the channel, to random doping fluctuation effects.

A preferred embodiment of the present invention is to provide triple-gate transistors, which can be manufactured using SOI processes. It will be appreciated that the writing of critical dimension levels (silicon islands and gate levels) can be made, for example, using an e-beam lithography machine. The e-beam lithography machine is capable of writing patterns with dimensions down to nano-scale. A mix and match approach can be used and non-critical levels can be written using conventional optical lithography. Oxidation and etching techniques, resist ashing techniques, hydrogen anneal or chemical etching e.g. in an ammonia solution can be used to reduce the cross-section of nanowire dimensions smaller than lines printed by the e-beam writer.

Figure 7:
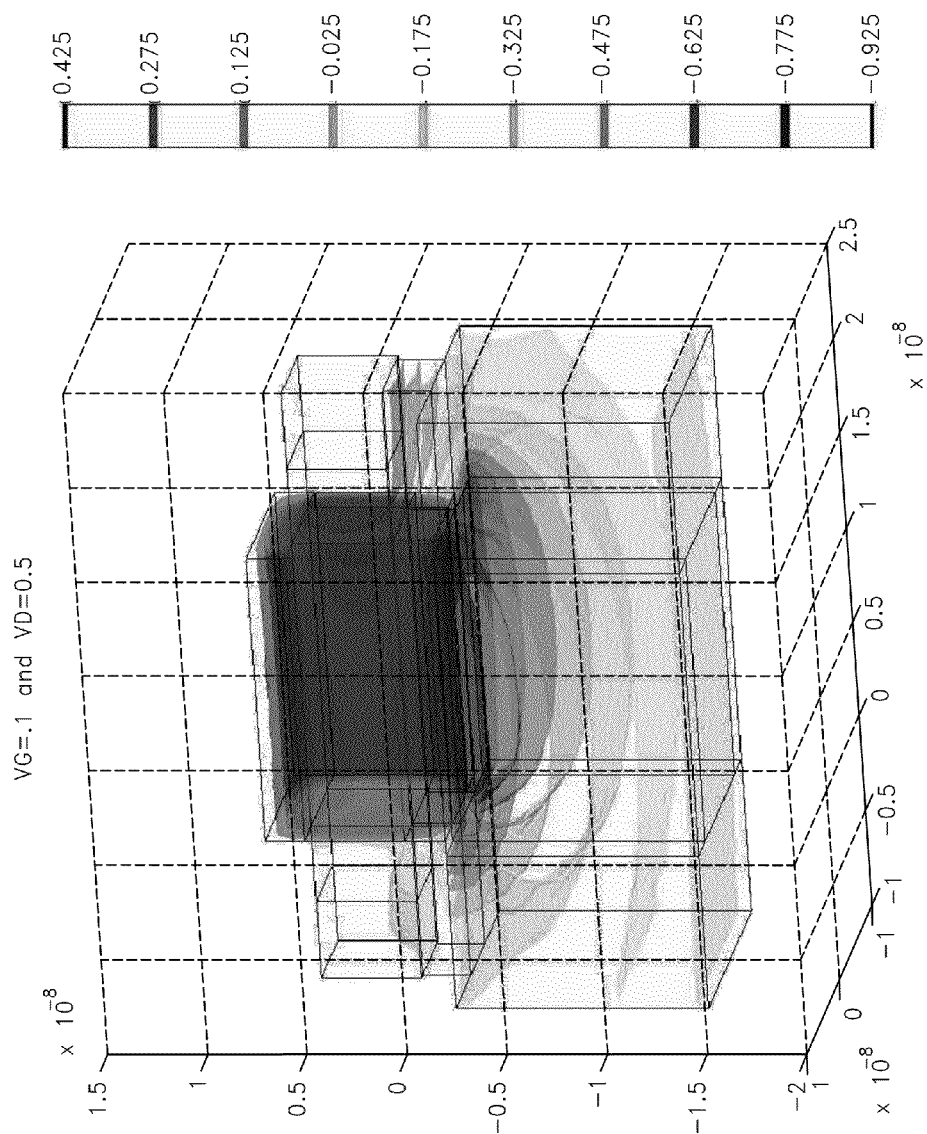
FIG. 7 illustrates a three dimensional model of the potential distribution of the present invention (trigate "nanowire" cross section)
Figure 8:
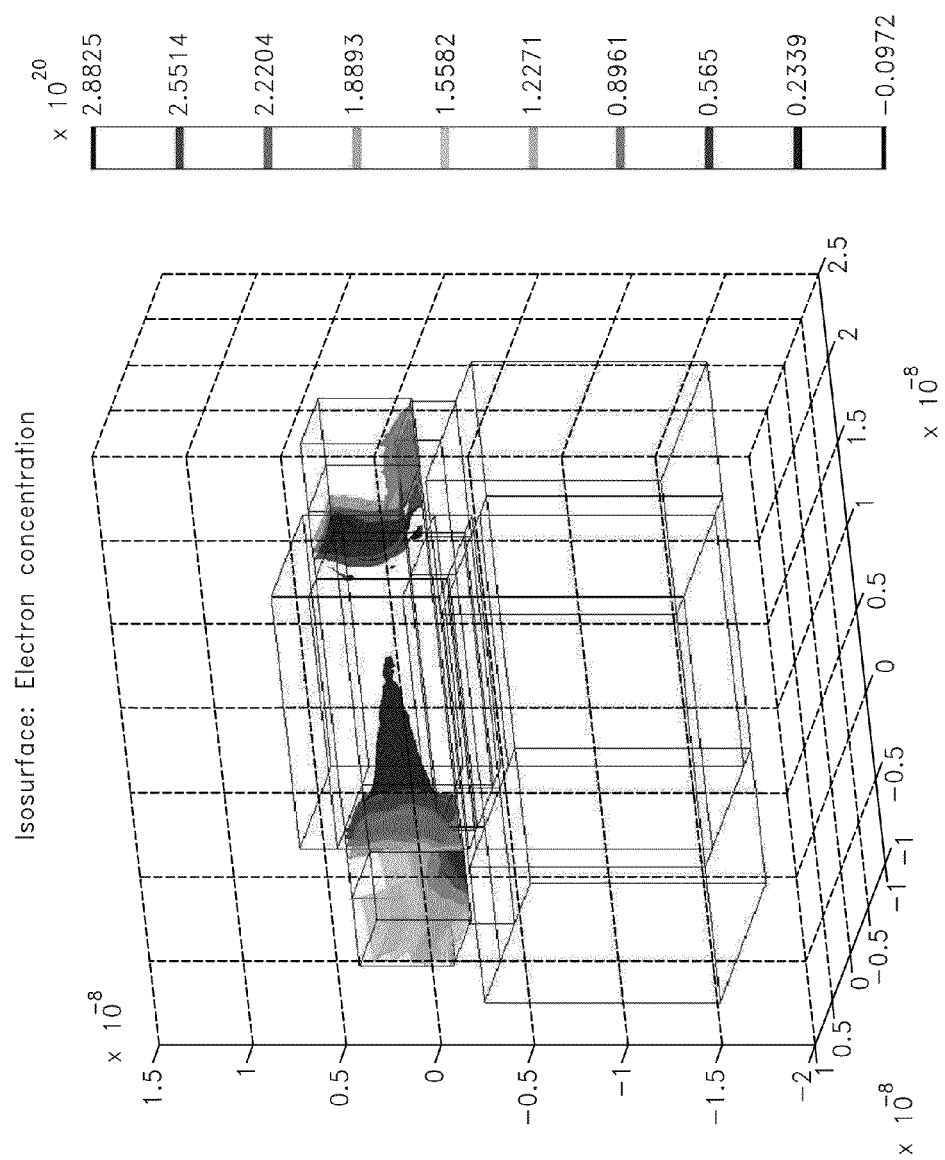
FIG. 8 illustrates a three dimensional model of the electron concentration of the present invention (trigate "nanowire" cross section)
Figure 9:
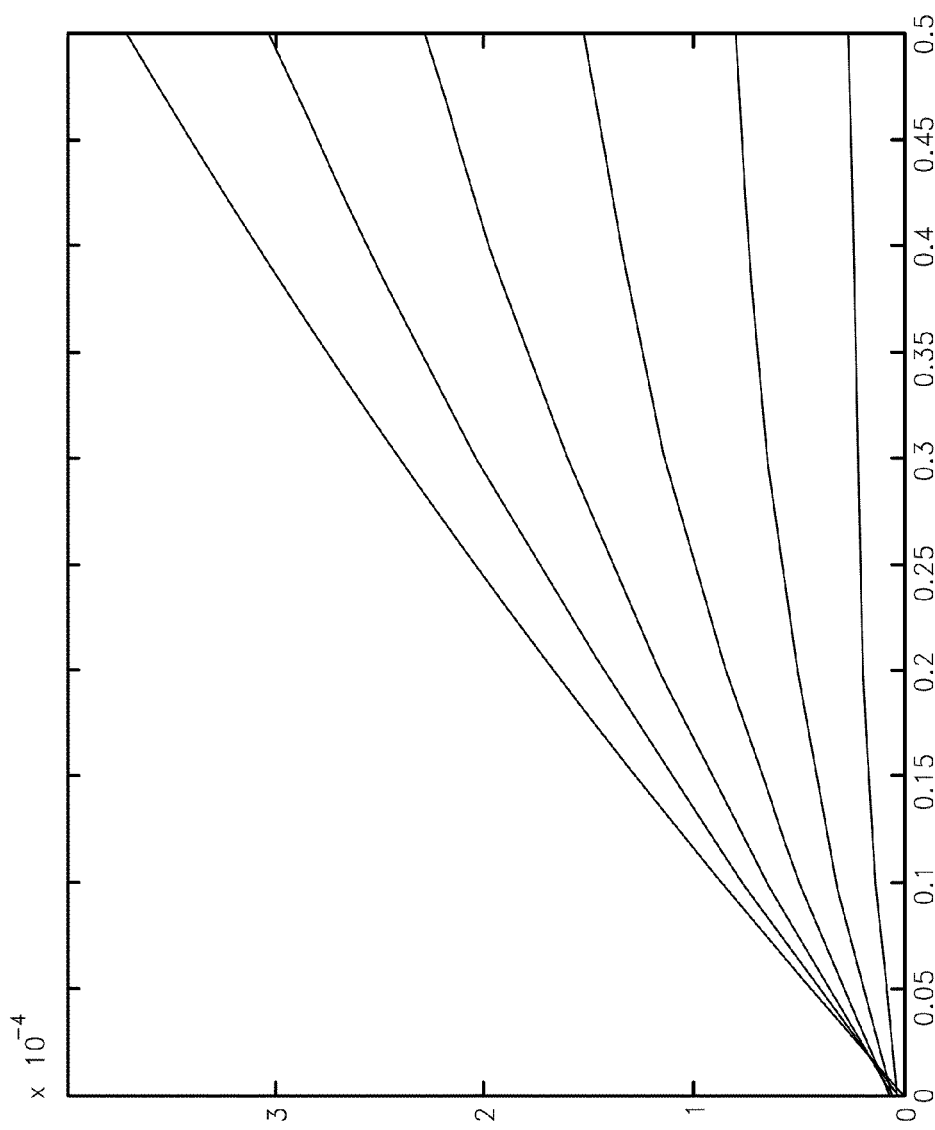
FIG. 9 is a graph of the simulated transistor output characteristics of the present invention (trigate "nanowire" cross section)

FIGS. 7, 8 and 9 illustrate the potential distribution, electron concentration and output characteristics of the transistor of the present invention and confirm that the transistor device operates as a regular transistor and can be turned off. FIG. 7 is a potential contour plot: Silicon thickness: $W_{si}$=5 nm; Silicon width: $t_{si}$=5 nm; gate oxide thickness: $T_{OX}$=2 nm: Channel length: L=15 nm; doping concentration: $N_D$=8e19 cm$^{-3}$; Gate voltage: $V_G$=−1V; drain Voltage: 0.5V. FIG. 8 is an Electron concentration contour plot: Silicon thickness: $W_{si}$=5 nm; Silicon width: $t_{si}$=5 nm; gate oxide thickness: $T_{OX}$=2 nm: Channel length: L=15 nm; doping concentration: $N_D$=8e19 cm$^{-3}$; Gate voltage: $V_G$=−1V; drain Voltage: 0.5V. FIG. 9 illustrates output characteristics (drain current vs. drain voltage); Silicon thickness: $W_{si}$=5 nm; Silicon width: $t_{si}$=5 nm; gate oxide thickness: $T_{OX}$=2 nm: Channel length: L=15 nm; doping concentration: $N_D$=8e19 cm$^{-3}$; Gate voltage: $V_G$=0:−0.1:−1V; drain Voltage: 0→0.5V.

Referring to FIGS. 10 and 11, FIG. 10 illustrates a cross section (gate-all-around device), indicated generally by the reference numeral 10, showing examples of doping concentrations in order to bring the invention into effect. Note that the source 2 channel 3 and drain 4 are of the same polarity and concentration. FIG. 11 illustrates the electron concentration in a cross section of the device when it is turned off, indicated generally by the reference numeral 20. The transistor device shown is a pi-gate MOSFET. The dark shaded N+ Source and N+ Drain represent high electron concentration (equal to the source and drain doping concentration), the lighter shading represents a lower electron concentration.

FIG. 12 shows the transmission electron microscopy image of a fabricated transistor device with a trigate "nanoribbon" cross section of 10 nm×30.5 nm according to the invention, indicated generally by the reference numeral 30. The top view shows a transmission Electron Micrograph of five parallel silicon gated resistor nanoribbons with a common polysilicon gate electrode. The nano-ribbon provides the source channel and drain as described above. The bottom view is a magnification of a single nanoribbon device. Individual atomic rows can be seen in the silicon.

Figure 13:
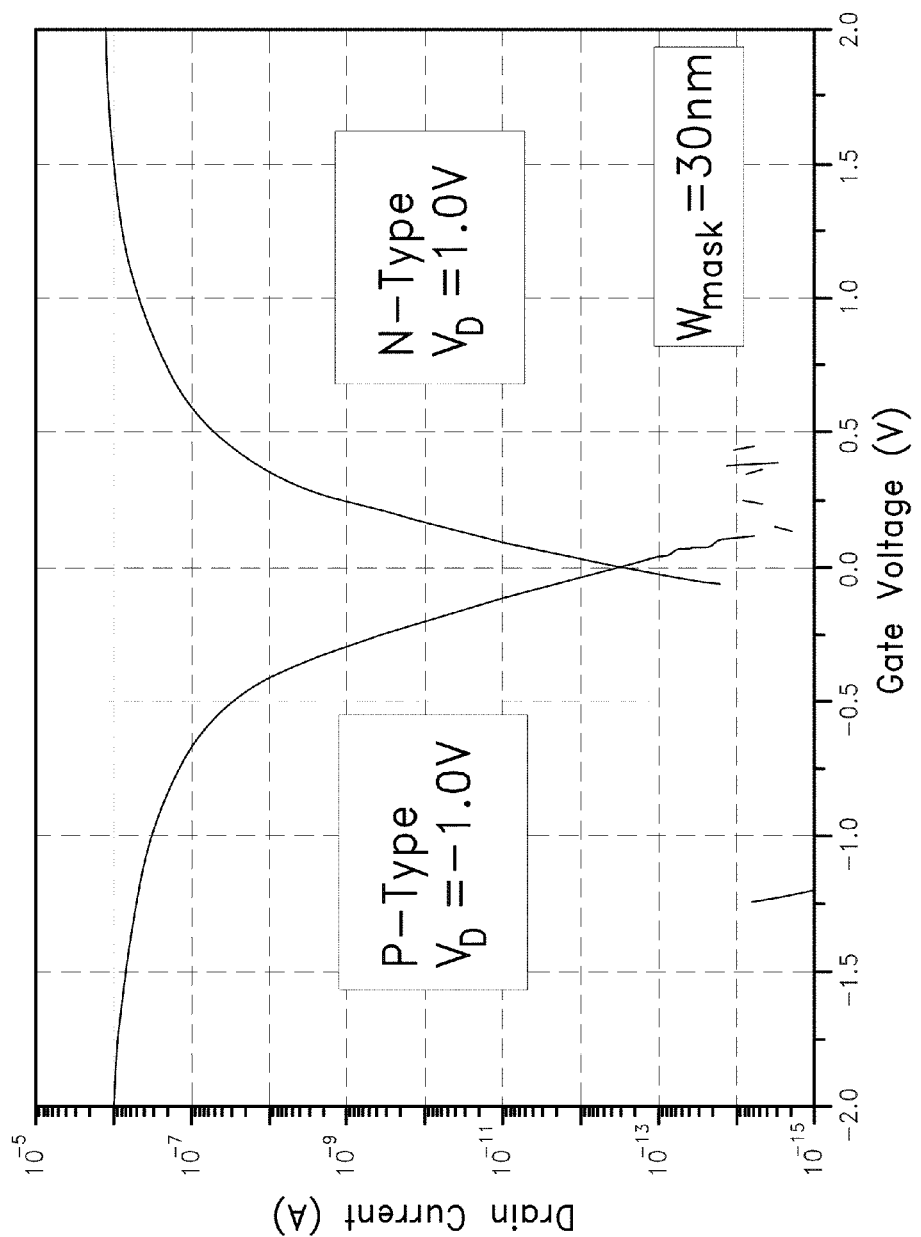
FIG. 13 illustrates the measured current as a function of gate voltage, both N-type and P-type devices are presented (trigate "nanoribbon" cross section)

FIG. 13 illustrates the measured current as a function of gate voltage in the fabricated device illustrated in FIG. 12, for a measured $I_D(V_G)$ of N- and P-channel trigate nanoribbon devices. L=1 um, W=20 nm. Both N-type and P-type devices are presented. For example the N-type curve shows that between 0V and 1V the ON/OFF current ratio is larger than 100,000,000, which is as high as in transistors with junctions. These measurements are highly significant as it shows that the transistor device fabricated shown in FIG. 12 can be turned ON and OFF properly using small voltages.

Figure 14:
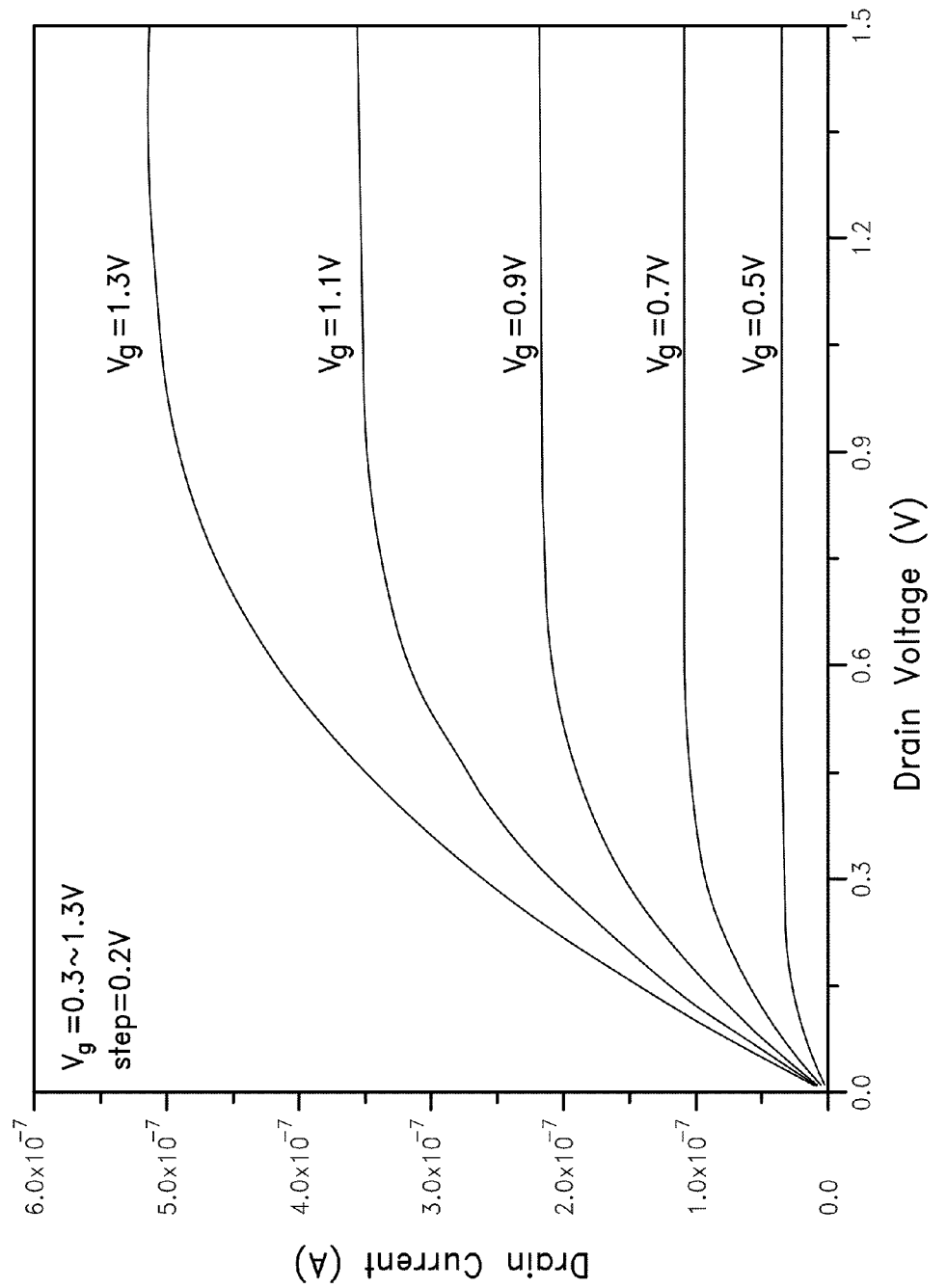
FIG. 14 illustrates the measured current as a function of drain voltage (output characteristics) of an N-type device (trigate "nanoribbon" cross section)
Figure 15:
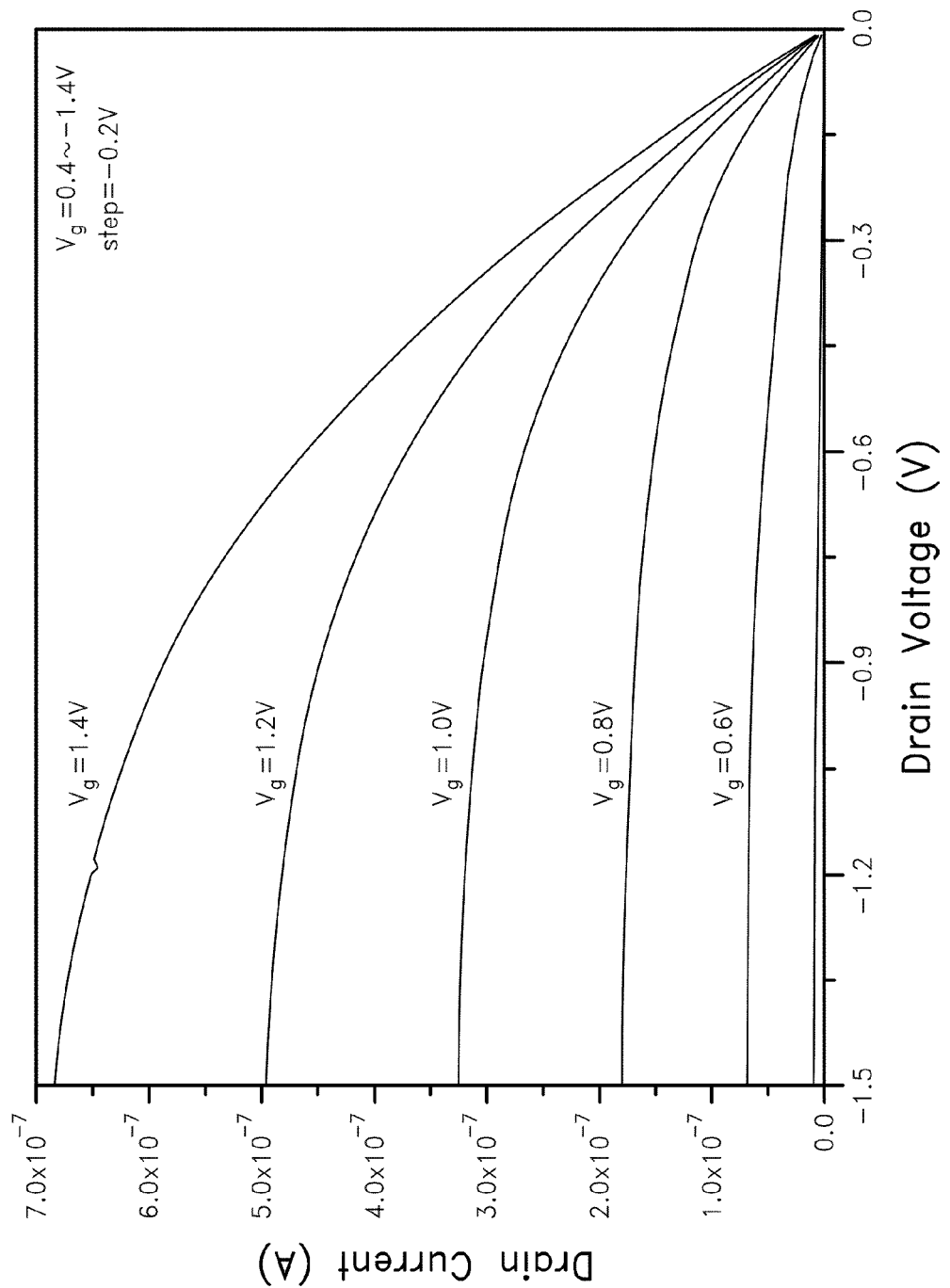
FIG. 15 illustrates the measured current as a function of drain voltage (output characteristics) of a P-type device (trigate "nanoribbon" cross section)

FIG. 14 illustrates the measured current as a function of drain voltage (output characteristics) of a fabricated N-type device with a trigate "nanoribbon" cross section of 10 nm×30 nm. FIG. 15 illustrates the measured current as a function of drain voltage (output characteristics) of a P-type device with a trigate "nanoribbon" cross section of 10 nm×30 nm.

In the context of the present invention a gate voltage has been described to control the region for the depletion of electrons in the channel. It will be appreciated that other control means can be used to control the gate electrode, for example current control or any form of electrostatic control.

Figure 16:
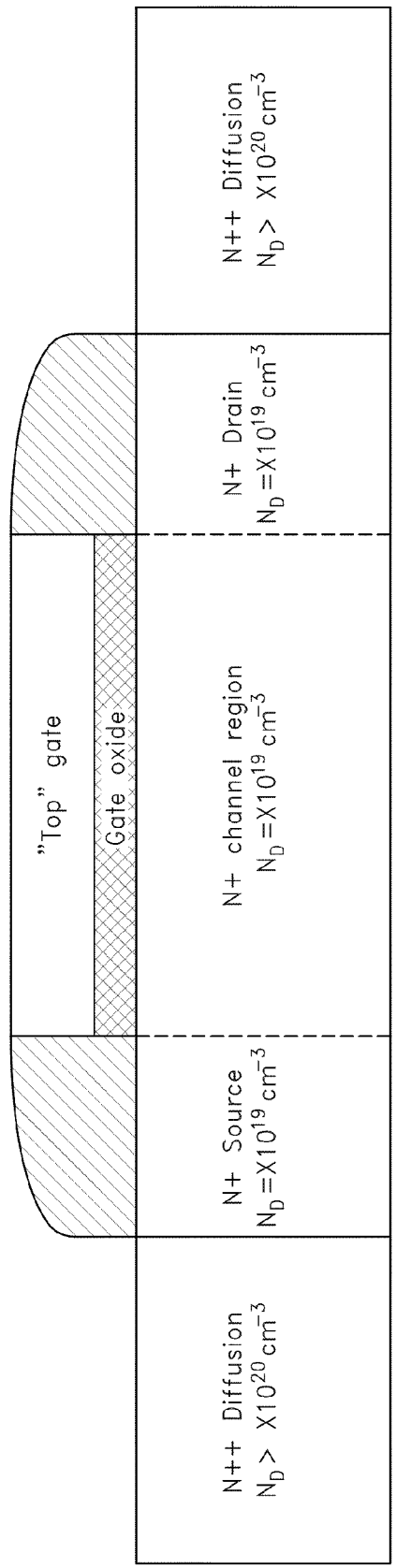
FIG. 16 illustrates a junctionless transistor with extra doping introduced in the outer source and drain using spacer technology, the dotted line indicates the approximate position of the junction in a non-junctionless transistor.

FIG. 16 illustrates an alternative embodiment of the present invention where a junctionless transistor with extra doping introduced in the outer source and drain using spacer technology is shown. The dotted line indicates the approximate position of the junction in a non-junctionless transistor.

Figure 17:
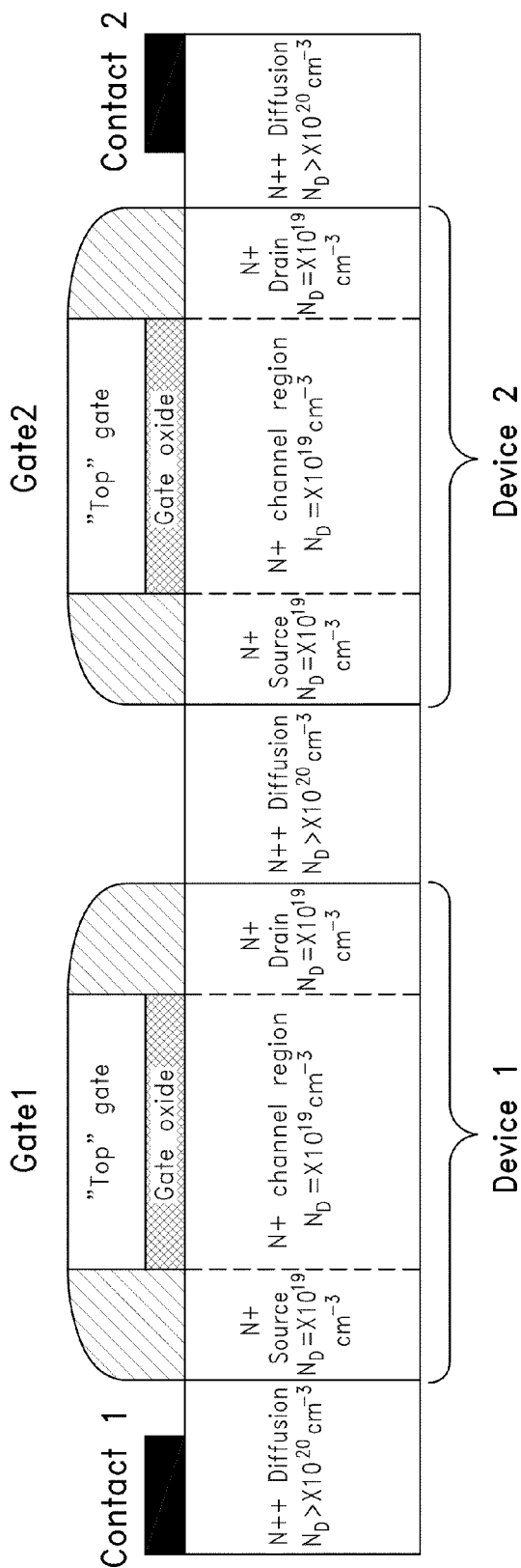
FIG. 17 is an example of device implementation (longitudinal cross section): two N-type junctionless transistors in series with contacts.
Figure 18:
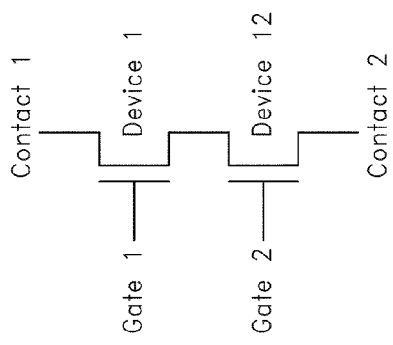
FIG. 18 is a schematic circuit representation of the transistor arrangement of FIG. 17, a classical MOS transistor symbol is used to represent the junctionless device, for convenience.

FIG. 17 is an example of device implementation (longitudinal cross section): two N-type junctionless transistors in series with contacts (FIG. 16 shows a single junctionless transistor). FIG. 18 is a schematic circuit representation of the transistor arrangement of FIG. 17, a classical MOS transistor symbol is used to represent the junctionless device for convenience.

Another advantage of using a device with a heavily-doped channel region is that fluctuations of electrical parameters due to dopant fluctuations are reduced. In classical 'large' devices, the number of doping atoms in the channel is large (say 1000 impurity atoms) such that small statistical fluctuations of this number (say 998 atoms in one device and 1002 in another one) does not induce significant fluctuations of the electrical parameters (a ±0.4% fluctuation in the present case).

In nanometer-scale devices, doping fluctuations become a huge problem since, for example, the channel of a device with a 10 nm×10 nm silicon cross section and a 20 nm gate length doped with a concentration of $10^{18}$ cm$^{-3}$ contains an average of only 2 doping atoms per cubic centimeter. The slightest statistical variation will bring the number of doping atoms to 1 or 3 (instead of 2), which represents a 50% variation. This has a high impact on the fluctuation of the electrical characteristics from device to device. Even "undoped" channels contain a doping concentration in the order of $10^{15}$ cm$^{-3}$, which means that most of the devices will be undoped, but one device in 2000 will statistically contain a doping atom and, therefore, have different electrical properties than the 1999 other devices. This effect has been analyzed in the paper entitled "Doping Fluctuation Effects in Trigate SOI MOSFETs", Ran Yan, Aryan Afzalian, Dimitri Lederer, Chi-Woo Lee, and Jean-Pierre Colinge, Proceeding 4th EuroSOI Workshop, pp. 63-64, 2008.

In the junction-less device of the present invention, the channel is heavily doped (around several $10^{19}$ cm$^{-3}$). As a result, a device with a 10 nm×10 nm silicon cross section and a 20 nm gate length statistically contains 40 doping atoms if the doping concentration is $2\times10^{19}$ cm$^{-3}$. Fluctuations of that number (say between 39 and 41 atoms) induce fluctuations of only ±2.5% of the doping concentration, which is much lower than in a device with "regular" channel doping. This is highly desirable and provides one of the main advantages of the present invention.

It will be appreciated that the use of spacer technology to locally increase the doping concentration in the source and drain regions outside the region of electrostatic influence of the gate electrode in the transistor described herein. To cite an example, a doping concentration of $0.8 \times 10^{20}$ cm$^{-3}$ can be used in the channel region and the source and drain regions (thereby forming a junctionless structure) and spacer technology can be used to locally increase the doping concentration in diffusion regions adjacent to the source and drain to a concentration above $10^{20}$ cm$^{-3}$.

It will be further appreciated that the inventive transistor device can be made using a Silicon on Insulator (SOI) process. In addition other types of fabrication processes for manufacturing a transistor can also be used in order to make the transistor, according to the invention: non-SOI devices such as the "bulk FinFET" device described in [K. Okano et al.: Process Integration Technology and Device Characteristics of CMOS FinFET on Bulk Silicon Substrate with Sub-10 nm Fin Width and 20 nm Gate Length. Technical Digest of IEDM, 725 (2005)] or the "body-tied FinFET" described in [Kyoung-Rok Han et al.: Design considerations of body-tied FinFETs (`MOSFETs) implemented on bulk Si wafers, Journal of Semiconductor Technology and Science 4-1, 12 (2004)] can also be fabricated with a junctionless architecture, provided appropriate electrical isolation from the substrate is achieved.

It will be further appreciated that the junctionless transistor device of the present invention can be made from any suitable type of semiconductor material such as, and not limited to, Germanium, SiGe, SiGeC, III-V alloys, polycrystalline semiconductors, etc.

The embodiments in the invention described with reference to the drawings comprises a process for manufacturing the transistor, according to the appended claims, and comprises a computer apparatus and/or processes performed in a computer apparatus. The invention also extends to computer programs, particularly computer programs stored on or in a carrier adapted to bring the invention into practice. The program may be in the form of source code, object code, or a code intermediate source and object code, such as in partially compiled form or in any other form suitable for use in the implementation of the method according to the invention. The carrier may comprise a storage medium such as ROM, e.g. CD ROM, or magnetic recording medium, e.g. a floppy disk or hard disk. The carrier may be an electrical or optical signal which may be transmitted via an electrical or an optical cable or by radio or other means.

The invention is not limited to the embodiments hereinbefore described but may be varied in both construction and detail.

The invention claimed is:

1. A transistor device comprising:
    a semiconductor material comprising first, second, and third portions, wherein the second portion is located between the first and third portions and wherein the first, second, and third portions are doped with dopants of the same polarity and the same or substantially the same concentration; and
    an electrode connected to the second portion, wherein a current flows between the first and third portions when a voltage is applied to the electrode, and the electrode is doped with dopants of a polarity that is opposite to the polarity of the dopants of the second portion.

2. The transistor device of claim 1, wherein the first portion comprises a source, the second portion comprises a channel, and the third portion comprises a drain.

3. The transistor device of claim 1, further comprising a voltage controller configured to vary the voltage to control the current.

4. The transistor device of claim 1, wherein the semiconductor material is junction-less.

5. The transistor device of claim 1, further comprising an insulating layer located between the electrode and the second portion.

6. The transistor device of claim 5, wherein the insulating layer comprises a high-K dielectric.

7. The transistor device of claim 1, wherein the semiconductor material comprises a nano-structure.

8. The transistor device of claim 7, wherein the nano-structure comprises a nano-wire or a nano-ribbon.

9. The transistor device of claim 1, wherein each of the first, second, and third portions are N$^+$-type.

10. The transistor device of claim 1, wherein each of the first, second, and third portions are P$^+$-type.

11. The transistor device of claim 1, wherein the electrode comprises a conductive material and wherein no current flows between the first and third portions when no voltage is applied to the electrode.

12. The transistor device of claim 1, wherein the electrode is attached to at least first and second surfaces of the second portion, the second surface being opposite the first surface.

13. The transistor device of claim 1, wherein the semiconductor material further comprises a fourth portion located adjacent to the first or third portion, wherein the fourth portion is doped with a dopant having the same polarity as and a higher concentration than the dopant in the first or third portion.

14. The transistor device of claim 13, further comprising:
    fifth, sixth, and seventh portions of the semiconductor material, wherein the sixth portion is located between the fifth and seventh portions and wherein the fifth, sixth, and seventh portions are doped with dopants of the same polarity and the same or substantially the same concentration as the dopants of the first, second, and third portions; and
    another electrode connected to the sixth portion, wherein a current flows between the fifth and seventh portions when a voltage is applied to the other electrode, wherein the fourth portion is between the first, second, and third portions and the fifth, sixth, and seventh portions.

15. The transistor device of claim 1, wherein the semiconductor material comprises at least one of the following: silicon, carbon, germanium, SiGe, SiGeC, a III-V alloy, and a polycrystalline semiconductor.

16. The transistor device of claim 15, wherein the III-V alloy comprises at least one of the following: boron, aluminum, gallium, indium, thallium, nitrogen, phosphorous, arsenic, antimony, and bismuth.

17. The transistor device of claim 1, wherein the electrode comprises at least one of the following: polysilicon, metal, and TiN.

18. A transistor device comprising:
    a semiconductor material comprising first, second, and third portions, wherein the second portion is located between the first and third portions and wherein the first, second, and third portions are doped with dopants of the same polarity and the same or substantially the same concentration; and
    an electrode connected to the second portion, wherein a current flows between the first and third portions when a voltage is applied to the electrode,
    wherein the concentration of the dopants is approximately $1 \times 10^{19}$ atom/cm$^3$ or greater.

19. The transistor of claim 18, wherein the concentration of the dopants is $2 \times 10^{19}$ atom/cm$^3$ or greater.

20. The transistor of claim 18, wherein the concentration of the dopants is $3 \times 10^{19}$ atom/cm$^3$ or greater.

21. The transistor of claim 18, wherein the concentration of the dopants is $8 \times 10^{19}$ atom/cm$^3$ or greater.

22. The transistor of claim 18, wherein the concentration of the dopants is between $1 \times 10^{19}$ atom/cm$^3$ and $1 \times 10^{20}$ atom/cm$^3$.

23. A method of manufacturing a transistor device, the method comprising:
doping first, second, and third portions of a semiconductor material with dopants of the same polarity and the same or substantially the same concentration, wherein the second portion is located between the first and third portions; and
connecting an electrode to the second portion, wherein a current flows between the first and third portions when a voltage is applied to the electrode, wherein the concentration of the dopants is approximately $1 \times 10^{19}$ atom/cm$^3$ or greater.

24. The method of claim 23, wherein the first portion comprises a source, the second portion comprises a channel, and the third portion comprises a drain.

25. The method of claim 23, wherein the semiconductor material is junction-less.

26. The method of claim 23, wherein connecting an electrode to the second portion comprises connecting the electrode to an insulating layer connected to the second portion.

27. The method of claim 23, wherein doping first, second, and third portions comprises N$^+$-type doping the first, second, and third portions.

28. The method of claim 23, wherein doping first, second, and third portions comprises P$^+$-type doping the first, second, and third portions.

29. The method of claim 23, wherein the electrode comprises a conductive material and wherein no current flows between the first and third portions when no voltage is applied to the electrode.

30. The method of claim 23, wherein the semiconductor material comprises at least one of the following: silicon, carbon, germanium, SiGe, SiGeC, a III-V alloy, and a polycrystalline semiconductor.

31. The method of claim 30, wherein the III-V alloy comprises at least one of the following: boron, aluminum, gallium, indium, thallium, nitrogen, phosphorous, arsenic, antimony, and bismuth.

32. A transistor device comprising:
first, second, and third means for conducting a current, wherein the second means is located between the first and third means, and wherein the first, second, and third means are doped with dopants of the same polarity and the same or substantially the same concentration; and
means for applying a voltage to the second means, wherein a current flows between the first and third means when a voltage is applied, wherein the concentration of the dopants is approximately $1 \times 10^{19}$ atom/cm$^3$ or greater.

33. The transistor device of claim 32, wherein the first means comprises a source, the second means comprises a channel, and the third means comprises a drain.

34. The transistor device of claim 32, wherein the first, second, and third means are junction-less.

35. The transistor device of claim 32, further comprising a means for insulating located between the means for applying a voltage and the second means.

36. The transistor device of claim 32, wherein each of the first, second, and third means comprises a semiconductor material of N$^+$-type.

37. The transistor device of claim 32, wherein each of the first, second, and third means comprises a semiconductor material of P$^+$-type.

38. The transistor device of claim 32, wherein the means for applying a voltage comprises a conductive material and wherein no current flows between the first and third means when no voltage is applied.

39. The transistor device of claim 32, wherein the first, second, and third means comprise at least one of the following: silicon, carbon, germanium, SiGe, SiGeC, a III-V alloy, and a polycrystalline semiconductor.

40. The transistor device of claim 39, wherein the III-V alloy comprises at least one of the following: boron, aluminum, gallium, indium, thallium, nitrogen, phosphorous, arsenic, antimony, and bismuth.

* * * * *